United States Patent [19]

Pitt et al.

[11] Patent Number: 4,928,319
[45] Date of Patent: May 22, 1990

[54] METHOD AND ARRANGEMENT FOR TRANSMITTING POWER IN OPTICAL FORM OVER OPTICAL FIBRES

[75] Inventors: Gilles D. Pitt, Saffron, Roger E. Jones, Cambridge; George R. Antell, Saffron Walden, all of England; Lyndon R. Spicer, Newport, United Kingdom; John A. Barnett, Orpington, United Kingdom; Robert Hill, Newcastle Upon Tyne, United Kingdom

[73] Assignee: Standard Telephones Cables Public Limited Company, London, United Kingdom

[21] Appl. No.: 328,761

[22] Filed: Mar. 24, 1989

Related U.S. Application Data

[63] Continuation of Ser. No. 258,054, Oct. 17, 1988, abandoned, which is a continuation of Ser. No. 788,586, Oct. 17, 1985, abandoned.

[30] Foreign Application Priority Data

Oct. 17, 1984 [GB] United Kingdom ............ 8426291

[51] Int. Cl.$^5$ .............................. H04B 9/00
[52] U.S. Cl. ...................... 455/612; 357/30; 455/605; 455/603; 455/617
[58] Field of Search ............ 455/603, 606, 605, 607, 455/609, 610, 612, 613, 617, 618, 619; 357/30

[56] References Cited

U.S. PATENT DOCUMENTS

| | | | |
|---|---|---|---|
| 4,434,510 | 2/1984 | Lemelson | 455/606 |
| 4,517,209 | 3/1986 | Forrest et al. | 357/30 |
| 4,525,873 | 6/1985 | Baues | 455/600 |
| 4,525,874 | 6/1985 | Baues | 455/600 |

FOREIGN PATENT DOCUMENTS

| | | |
|---|---|---|
| 0041668 | 12/1981 | European Pat. Off. |
| 0075701 | 4/1983 | European Pat. Off. |
| 0084958 | 8/1983 | European Pat. Off. |
| 2019032 | 10/1979 | United Kingdom |
| 2056666 | 3/1981 | United Kingdom |
| 2064112 | 6/1981 | United Kingdom |
| 2150780 | 7/1985 | United Kingdom |

OTHER PUBLICATIONS

Handbook of Fiber Optics: Theory and Application, Wolf, p. 53, Dec. 29, 1980.

Primary Examiner—Benedict V. Safourek
Assistant Examiner—L. VanBeck
Attorney, Agent, or Firm—Kerkam, Stowell, Kondracki & Clarke

[57] ABSTRACT

Power transmission to a remote consuming device, especially for undersea applications including towed arrays, static arrays, submersible links to submersible vehicles, or surveillance devices, links to divers, and dunking sonars, uses on the transmission medium an optical fibre. This fibre has a thickness in the range 150–300 um, i.e. it is of the so-called fat type, and is a long wavelength fibre for conveying light whose wavelength is in the range of 0.7 to 1.7 um.

The light source uses lasers or super-luminescent diodes, a preferred light source being an array of individual laser diodes which are pulsed and/or cooled to improve power handling capacity. These diodes each feed optical energy into a short length of optical fibre and these fibres are coupled via an optical coupler into the main transmitting fibre.

At the receiving end another optical coupler feeds via individual fibres an array of detectors each of which is preferably a photo-voltaic cell formed of layers of suitable doped indium phosphide and indium gallium arsenide. Each such cell has its own output electrodes and these cells are connectable in series, parallel or series-/parallel dependent on the desired output.

10 Claims, 4 Drawing Sheets

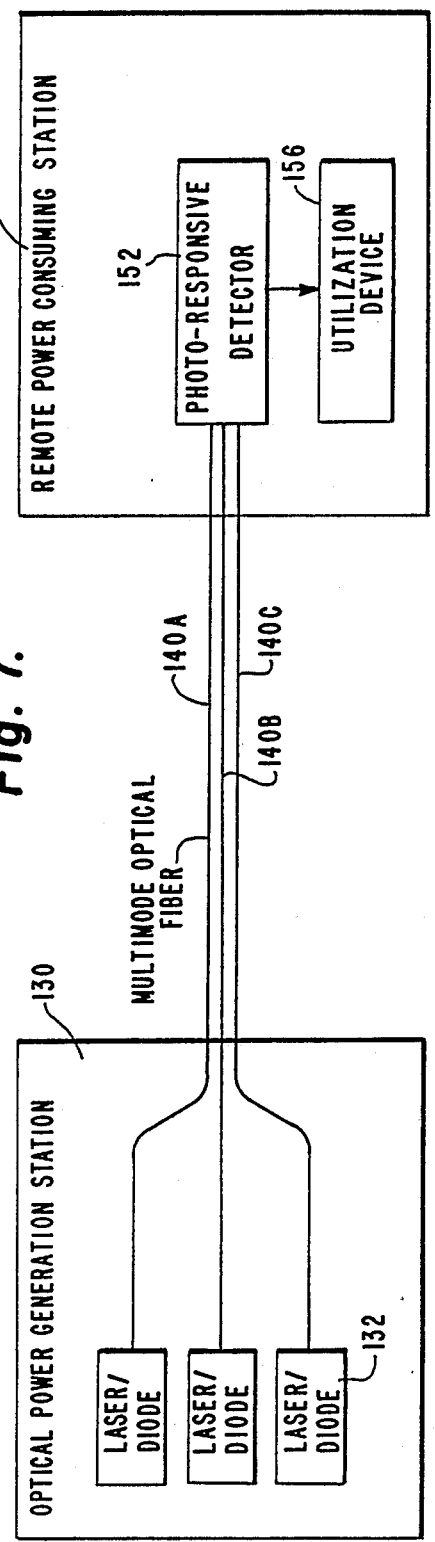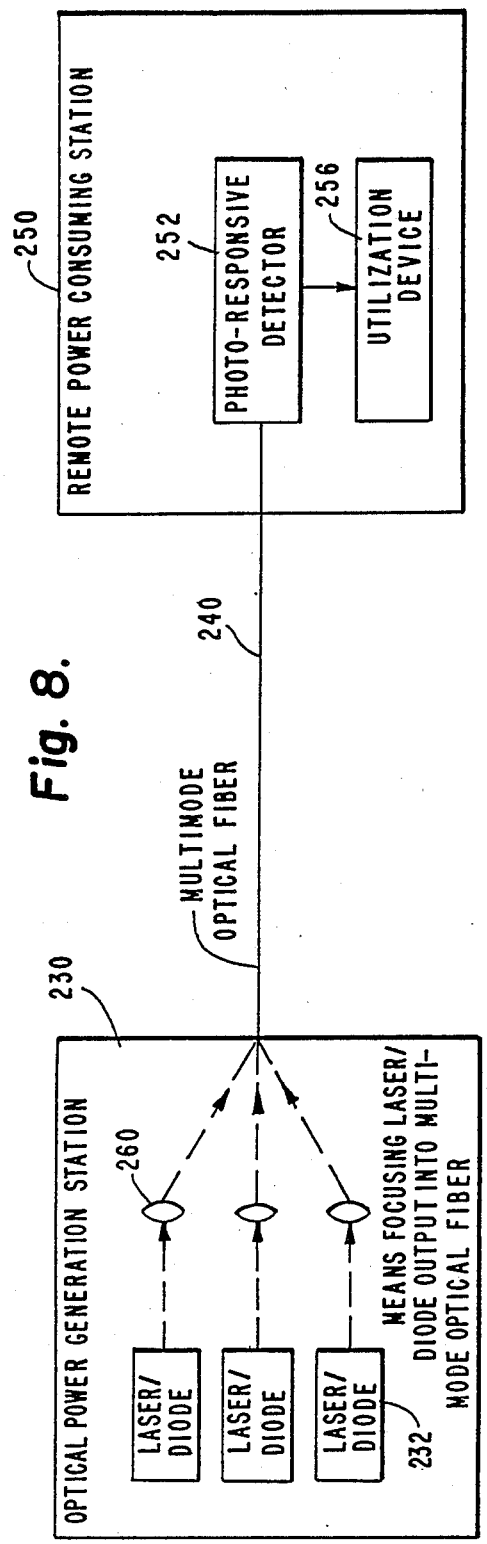

METHOD AND ARRANGEMENT FOR TRANSMITTING POWER IN OPTICAL FORM OVER OPTICAL FIBRES

This is a continuation of Application Ser. No. 258,054, filed Oct. 17, 1988, which is a continuation of Ser. No. 788,586 filed 10/7/85, both now abandoned.

FIELD OF THE INVENTION

This invention relates to the supply of power to remote objects via optical fibres.

The transmission of power via optical fibres to a remote device to be powered or controlled is known. Thus in published British Appln. No. 2150780, there are described arrangements for optically remotely power-actuating a controlled device, e.g. a hydraulic or pneumatic valve, where high optical powers are likely to be safe, e.g. for underseas applications. The power, e.g. from a high power laser, falls on a heat absorbent surface after it has travelled along the optical fibre, as a result of which a volatile liquid, e.g. one of the freons, is evaporated. This, via a bellows, drives an output rod which operates the controlled device. Alternatives for responding to the light in that application included a bimetallic strip, a thermostat-type capsule, or a memory metal strip.

Such an arrangement gives satisfactory results, since the amount of power needed to operate the remote device is relatively low.

SUMMARY OF THE INVENTION

An object of this invention is to extend the principle of the optical transmission of power to systems where the amount of power to be conveyed is relatively large, and/or the distances over which the light is to be conveyed are relatively large.

According to the invention, there is provided a method of providing power to a remote power-consuming or direct actuating device, in which the power is conveyed as light via long-wavelength optical fibres of the multi-mode type, in which the light thus conveyed has wavelengths of the order of 0.70 to 1.7 $\mu$m and is generated by high-power gas or solid-state lasers or super-luminescent diodes, in which the fibres used to convey the light power have relatively thick cores, in the range of typically 50 to 400 $\mu$m, and preferably the fibre has a thickness in the range of 150 to 300 $\mu$m in which the light falls at the remote device on a detector of the photo-responsive type, and in which the output from the detector is applied to an utilisation device.

According to another aspect of the invention, there is provided a method of transmitting power for the remote operation of surveillance, communications and control systems or devices, in which the power source is connected to the system or device by a cable of an optical fibre material capable of conveying enough power to the system or device, in which the power is supplied to the optical fibre from a light source driven by the power source, and in which at the remote system or device the light conveyed by the fibre falls on a light responsive device such as a solar cell or a photo-chemical conversion device, the light responsive device providing the power for said system or device.

Such arrangements have advantages over more conventional power supply arrangements where electricity is supplied over metallic conductors. Thus the optical fibres are lighter than metallic conductors, and may have a certain buoyancy. This is significant for such uses as "dunking" sonars carried by helicopters and towed arrays for submarine detection, and umbilical links to submersible vehicles. In such cases, as in others where security is important, the fibre also has the advantage that it is not susceptible to electro-magnetic interference and does not radiate signals. Hence in its turn it does not cause interference. Yet another advantage is the ease of rapid deployment, due to the relative lightness of fibre optic cable as compared with standard metallic supply cables.

BRIEF DESCRIPTION OF THE DRAWINGS

Embodiments of the invention will now be described with reference to the accompanying drawings, in which

FIGS. 6, 7, and 8 illustrate, schematically, three different embodiments of a power transmission arrangement.

Figure 1:
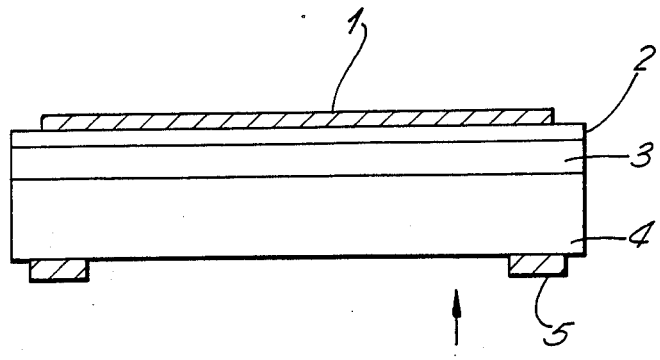
FIGS. 1, 2, 3, 4 and 5 show forms of detectors usable in the above mentioned methods.

The methods referred to above use a combination of the power source, the optical fibres and the detection and power storage. In addition, some means activated in response to the power supply may be used. These aspects will be considered separately.

Power Sources

The preferred power sources are solid-state lasers, although of laser, and also the so-called super-luminescent diodes, can be used. For operation at the wavelengths in the range given above the following types are suitable:

(i) F-centre laser, which can produce a continuous wave (CW) output of the order of 100 mW. It works in the TEM mode, with wavelengths in the range 1.4 to 1.6 $\mu$m.

(ii) Neodymium-YAG laser, whose CW output is in the range 30 mW to 600W, and works in either the TEM mode or multi-mode, wavelengths available being 1.6 $\mu$m and 1.3 $\mu$m.

(iii) Solid-State lasers, such as GaAsP and InGaAsP with wavelengths near 0.88 $\mu$m, 1.3 $\mu$m and 1.55 $\mu$m.

In addition to solid state lasers, so-called super-luminescent diodes of the GaAsP and InGaAsP type can be used.

In some cases pulsed power may be applicable, e.g. pulsed lasers can be used where the relatively high peak power levels of the lasers can be used to activate quartz or thin silicon sensors, i.e. to excite resonant structures.

Where the arrangements described are to be used for long distance transmission of power, solid state lasers with coding of the power transmitted are specially suitable.

Using 1.55 $\mu$m lasers is advantageous as they are compatible with the 1.55 $\mu$m minimum absorption wavelengths appropriate to long wavelength fibres. Further, coding which is needed, is desirable in many, especially security based applications. The use of such a wavelength is relatively safe since for wavelengths less than 1.4 $\mu$m the human eye absorbs, so that the maximum permissible level is 2.8W at 0.85 $\mu$m at 10 cm viewing distance. Underwater, the use of such fibre is even safer due to water absorption. Another advantage is that long wavelength lasers usually have better thermal conduction properties than other lasers and are less susceptible to facet damage.

Lasers are available which produce 40–100 mW, typically CW, at room temperature, using a single large-capacity channelled narrow stripe laser with a mesa structure. In one arrangement several such stripes can be positioned across the end face of a large core fibre, i.e. a so-called fat fibre. With a focussing lens, either on the laser package or in an associated connector, the light into the fibres may be about 80 mW (i.e. 66% of 120 mW, where the 120 mW originates from three × 140 mW from the three stripes).

A preferred light source may use three such laser stripes across the fibre core, with the stripes separated by 25 μm, each such stripe giving 40 mW. Then with a focussing lens, either on the laser package or in the connector between the laser tail and the optical fibre, 80 mW is launched into the fibre. Assuming that losses in the multimode fibre at 1.55 μm are of the order of 0.5 dB/km, we get 40 mW sent over 6 Km. If the laser is cooled, higher power can be handled, and supplied from the laser into the fibre. With suitable cooling 1 watt may be receivable over 6 Km of fibre.

When the fibre used is monomode, only one laser can be used to drive the fibre.

Several lasers can be used to launch the light into the fibre, and they can be arranged in arrays, e.g. linear or co-ordinate arrays. Such lasers can be diode lasers, and would feed into separate initial fibres, which fibres go via an optical coupler to the main fibre. Alternatively, the fibres may be separate in the cable without using a coupler. If a multiway coupler is used the intensity of light transmitted in the main fibre will not be an additive sum of all the input intensities. This is due to the nature of such couplers.

Optical Fibres

For many uses, especially undersea ones, so-called "fat" fibres may be used as they have the advantage that there is little risk of hot spots at the couplers. Further, low-loss multi-way couplers are available. Such "fat" fibres can be cabled together with a single-mode fibre for data transmission. Thus relatively high power can be taken to a system node, and there used to activate sensors and to provide high bandwidth information back over the single mode fibre, using a laser or an LED source at the node. In some cases, dependent on the application and power needed, standard multimode 50 μm, 85 μm, or 100 μm core fibre can be used.

Alternatively, the light used to power the node, which is CW, can be modulated and returned via a single or multimode fibre.

One of the limiting factors which has to be considered in some applications of the invention is the limiting non-linear effects such as Raman scattering/Brillouin scattering on the ability of the fibre to convey power. In this respect, attention is directed to an article entitled "Observations of Stimulated Brillouin scattering in low-loss silica fibre at 1.3 μm", by D. Cotter, Electronics Letters, 10th June, 1982, Vol.18 No. 12. Such effects limit the transfer of power down fibres, the limit being fairly low in the case of single-mode fibres, but much higher in the case of multimode fibres. Hence multimode fibres are preferred.

In a typical result for a single mode fibre, 50 μm core with 125 μm cladding, with an assumed attenuation of 1 dB/Km, the limit for input power is found to be 172 mW, with about 50–60 mW output saturation. For a "fat" fibre with a 250 μm core and again assuming attenuation of 1 dB/Km, the input threshold is found to be 2.7W, and an output maximum of 700–900 mW. These results are all using light of wavelength 1.3 μm.

Detection

Depending on the application, several detection methods can be used at the powered node. These are:

(a) Photo-acoustic, in which light modulation is converted to gas expansion and contraction effects, and the output can then be acoustically magnified. Where such a detection device is used to respond to the "power" beam the latter is not continuous wave.

(b) Photo-mechanical, i.e. the storage of power and activation of a bimetallic strip, a piezoelectric bimorph, an expandable gas such as a freon, or memory metal. Some of these detection methods are described in our above mentioned published Patent Application. Another detector of this general type uses the photo-acoustic effect, e.g. carbonised cotton in a gas cell.

When a bimetallic strip is used it can be coated with a material such as vanadium dioxide, which goes through a phase transition at about 60° C., giving an enhanced snap action.

(c) Photo-cell and Photo-chemical devices with battery storage

When we use radiation at 1.55 μm; InGaAs or Ge solar cell detection can be used. Another form of detector which can be used is one derived from vapour phase or MOCVD techniques to get InGaAs devices with InP substrate, see FIG. 1.

In FIG. 1 we see a cell with a contact 1 below which there is a layer 2 of p-type indium phosphide. This is on an InGaAs recombination zone 3, on a substrate 4 of n-type indium phosphide. Radiation falls on this cell as shown by an arrow, on a region surrounded by a ring electrode 5 In such a structure, with InP on top of InGaAs a passivated planar detector can be made.

Figure 2:
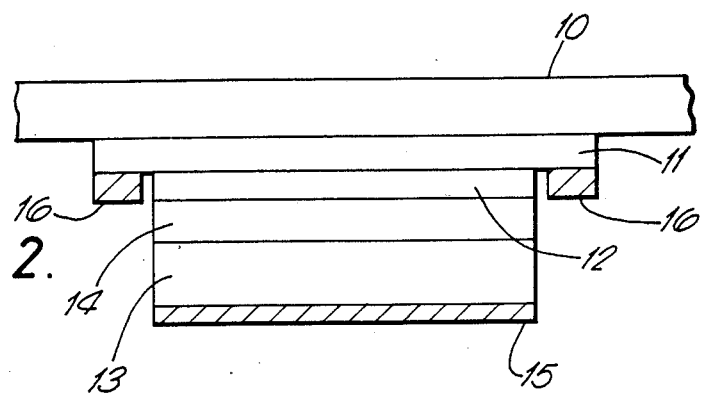

Another device of the same general type is shown in FIG. 2. Here we have a layer 10 of semi-insulating indium phosphide at which the end of the fibre is "aimed", this layer being a 200 μm thick wafer. Immediately under this there is a front contact 11 formed by a 2–4 μm thick LPE indium phosphide layer, the material being n+-type with a doping level of $10^{18}$ to $10^{19} cm^{-3}$. Below this there is a buffer layer 12 which is 1 μm thick of n−-type $10^{16} cm^{-3}$ indium phosphide. This buffer layer is needed to prevent contact down possible pin-holes of the p+-Indium gallium arsenide layer 13 (see below) with the n+ layer 11 which forms the front contact. With the material used for this buffer layer its series resistance is relatively low.

Below the buffer layer we have a layer 14 of 3 μm thick LPE indium gallium arsenide, n−-type $10^{16} cm^{-3}$, below which is the layer 13, which is of 5 μm thick LPE indium gallium arsenide, p+-type $10^{18} cm^{-3}$. This layer 13 bears a metallisation 15 of titanium-gold alloy, and this with a ring-shaped metallisation 16 provides the contacts to the device via which the electrical power generated as a result of the incident light is available for use.

The front contact layer 11 is a current-collecting layer, and its contribution to the series resistance of the device could be a limiting factor in cell performance. To reduce it the layer could be made thicker and/or doping increased.

In considering absorption in the cell it will be appreciated that if the metallization layer 15 is a good mirror, the effective light path within the device may be doubled, with beneficial effect on power conversion.

Figure 3:
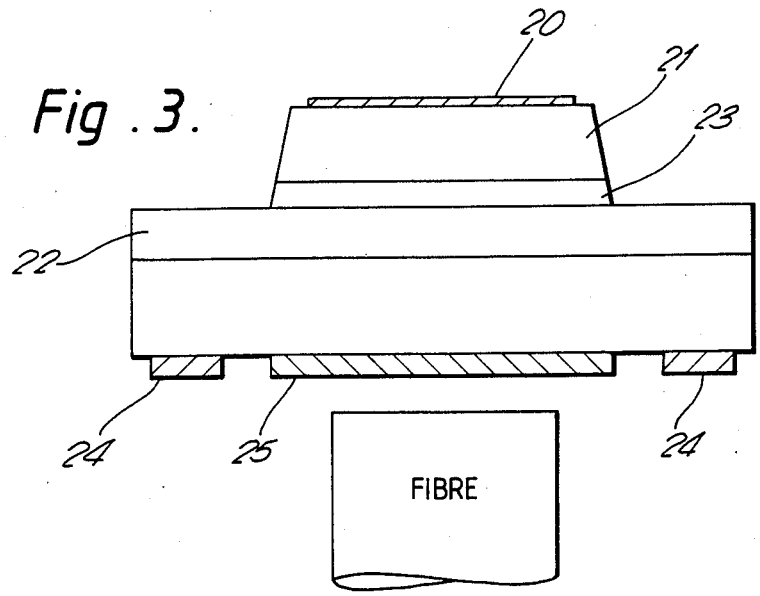

FIG. 3 shows a detector similar in many respects to that of FIG. 2. Here, starting at the top we have a metallisation layer 20 below which is a p+ InGaAs layer 21 which is 2 to 5 μm thick. This is separated from an n-type InP layer 22 by a layer 23 of n-type InGaAs, which has a thickness (or perhaps thinness) of one diffusion length or less. Below the layer 22 is an n+ indium layer which bears a ring contact 24, which surrounds an anti-reflective film 25 of $Si_3N_4$.

Since no voltage is applied to the detector when in use, the photo-generated carriers reach the p-n junctions by diffusion, so that the thickness of the absorbing layer should be small. In an all InGaAs structure, light can be absorbed on both sides of the junction and contribute to photocurrent.

Although such a cell would be useful in some relatively low-power applications it would be desirable for power conversion to be improved for the higher power applications. A device arrangement which would meet these needs is shown in FIGS. 4 and 5.

Here the detectors consist of a linear array of individual cells to each of which a fibre is directed. Although only one fibre is shown, there are a number of such fibres each directed at one or more of the cells, these fibres being coupled by a multiway coupler to the main fibre or reaching the detectors as separate fibres from the source(s). As before the fibre ends are actually secured to a 200 μm layer of n− Indium phosphide, and as can be seen the layers of the various materials used are generally as for the device of FIG. 2.

The individual cells as shown are separated by "spacers" of $Si_3N_4$, or possibly polyimide with metallisation to back up the cells. As before, the device efficiency is improved if this metallisation is a good mirror.

Figure 4:
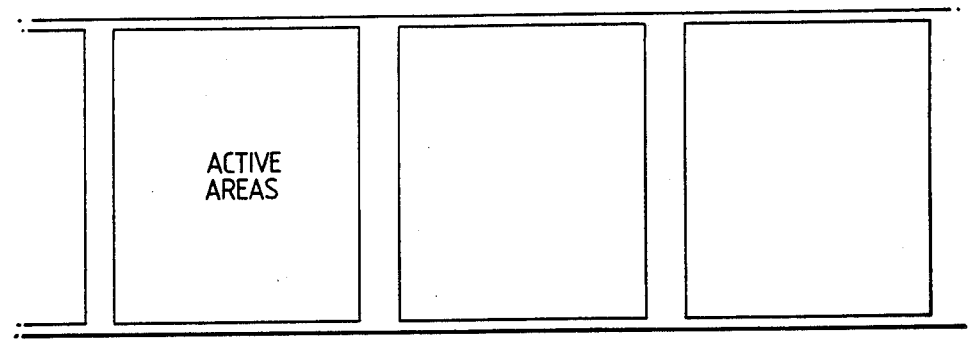
Figure 5:
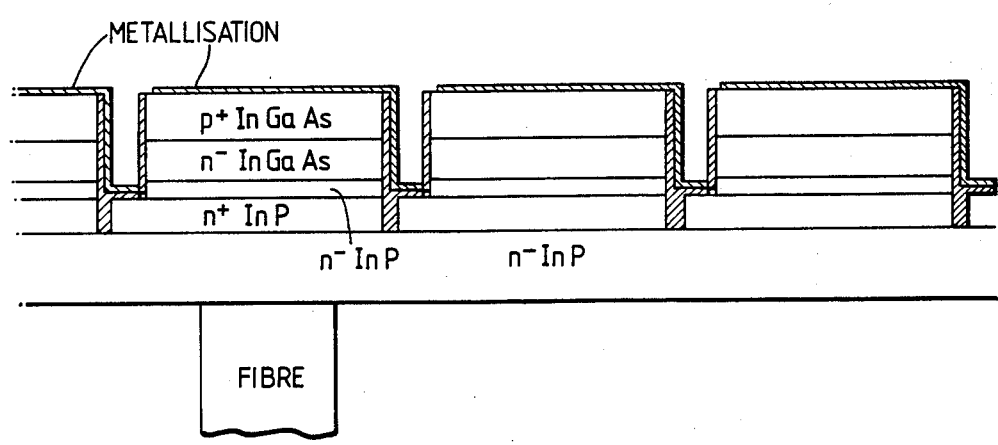

With arrangements such as shown in FIGS. 4 and 5, it is possible to couple ten 100 μm fibres, one to each of ten cells, with the fibres combined into one relatively fat fibre for conduction of light from the power source. The optical losses in this mode can be kept to a few dB if device size is such as to cover the beam output of the fibre, i.e. a device, size of 150 μm diameter should cover a beam from 100 μm fibre.

Other devices usable as detectors include germanium photo-voltaic devices, which are currently available. For the conversion of 100 mW of optical energy at 1.3 μm, sixteen germanium cells, each 3 mm square and connected in series gives 5 volts or more at 4 mA. This is adequate for the operation of many electronic devices.

Note that the cells can have their outputs in series, in parallel or in a series-parallel combination, as dictated by the power consuming devices.

In the case of underseas applications of the arrangements described above using relatively long lengths of fibre, the good temperature stability of the sea bed, which is usually in the 5°-15° C. region provides for improved efficiency in detection and in opto-electronic conversion with germanium and III-V detectors.

To consider efficiency briefly, taking 100 mW of power through a fibre at 1.3 μm wavelength, conversion into electrical power can be done using photo-voltaic devices. Thus germanium devices are commercially available which can be assembled into an array of sixteen cells each 3 mm×3 mm and connected in series. This gives 5 volts or more output at 4 mA. Other devices can be based on more complex semiconductor devices as referred to above, e.g. one based on LPE deposition of $In_{0.53}Ga_{0.47}As$ on InP. Devices of about 150 μm size can be series-connected, in which case ten cells would give over 5 volts at 6 mA. Each cell is powered by one fibre glued to the InP wafer, and the ten fibres could have a common multi-fibre cable or fan out from a common fibre. This is optically and electrically efficient, very small and robust.

Figure 6:
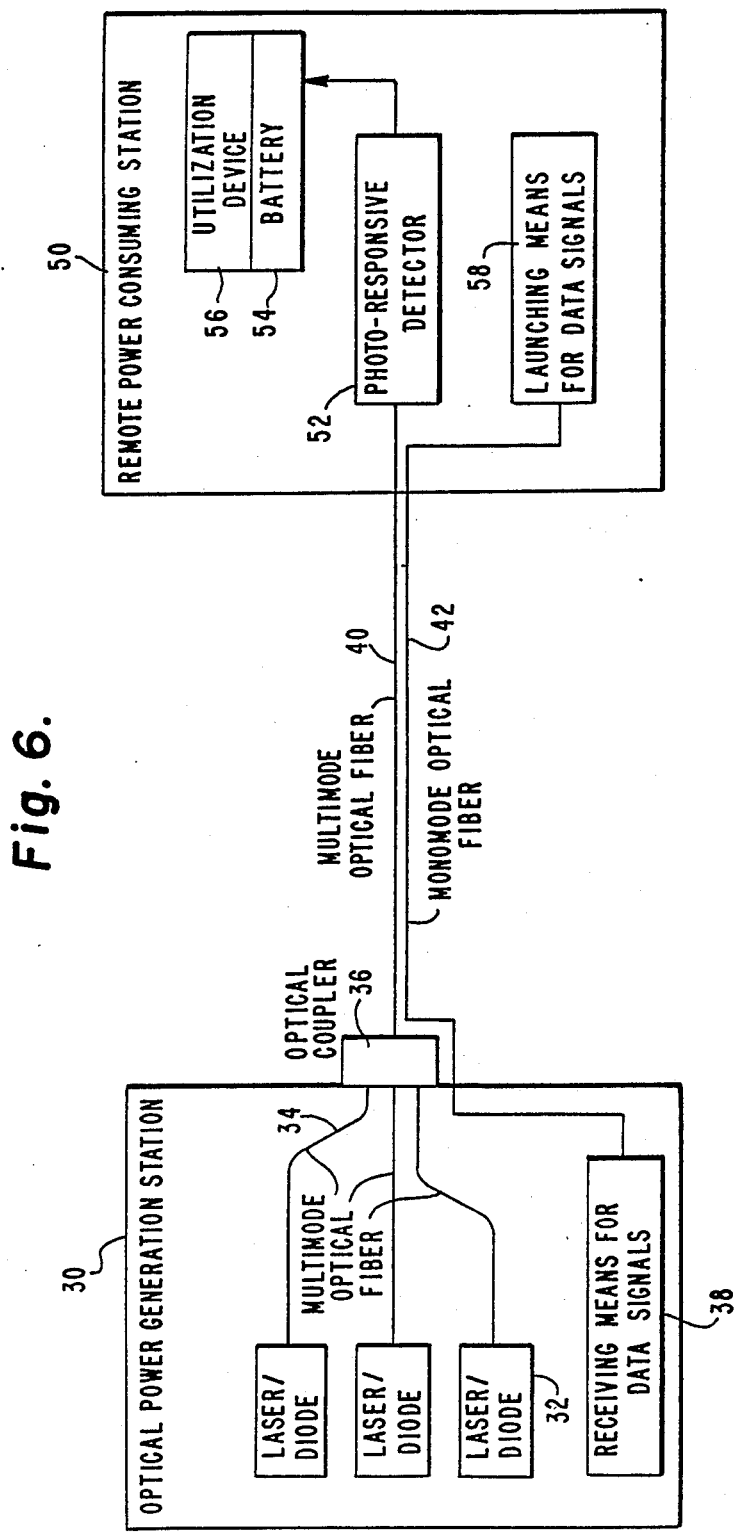

As shown in FIG. 6, an optical power generation station 30 may include a series of lasers or superluminescent diodes 32 supplying light into corresponding multimode optical fibres 34 which lead to optical coupler 36. The station 30 may also include a receiving means 38 for receiving data signals as discussed below.

The optical coupler 36 couples its input light into a multimode optical fibre 40 which conveys the light to a remote power consuming station 50. the station 50 includes a photo-responsive detector 52 connected to a battery 54 and utilization device 56. Additionally, the remote station 50 includes a launching means for data signals 58 which may supply data back to the receiving means 38 by way of a monomode optical fibre 42.

FIG. 7 shows an alternate arrangement with the components labeled in the "100" series having the same last two digits as the corresponding component, if any, of the embodiment of FIG. 6. In particular, the optical power generation station 130 includes lasers or diodes 132, each of which is connected to a corresponding one of a series of multimode optical fibres 140A, 140B, and 140C. The fibres lead to a remote station 150 having a photo-responsive detector 152 which powers a utilization device 156.

FIG. 8 shows an alternate embodiment with components labeled in the "200" series and with the same last two digits as the corresponding component, if any, of the embodiment of FIG. 6. The optical power generation station 230 includes a series of lasers or diodes 232 which apply energy to a fibre 240 by way of focusing means such as lenses 260. The fibre 240 supplies the light to a remote station 250 having a photo-responsive detector 252 and a utilization device 256.

We claim:
1. A power transmission arrangement in which operating power for a remote device is conveyed as light, the arrangement comprising a power generation station for generating optical power, a remote power consuming station separated from said power generation station, and optical fibre means coupling the power generation station to the power consuming station for conveying said optical power thereto, said optical fibre means comprising a long wavelength multimode first optical fibre having a relatively thick core size in the range 50 to 400 μm, the power generation station including a plurality of high-power gas or solid-state laser or superluminescent diodes, each having an optical output with a wavelength of the order of 0.70 to 1.7 μm and each feeding light energy into a respective second length of multimode optical fibre, and means for inputting the optical power output of the power generation station into one end of the said optical fibre means, said inputting means comprising an optical coupler coupled to the respective second lengths of multimode optical fibre from said plurality of lasers or diodes and to one end of the first optical fibre, wherein the remote power consuming station includes a photo-responsive detector upon which the optical power conveyed thereto and output from another end of the optical fibre means falls, and a utilization device coupled to the detector for utilizing said power, and wherein the detector includes a layered structure of the following layers:

(i) a first relatively thick layer of the order of 200 μm of indium phosphide doped to have an n⁻ semi-insulating characteristic for receiving optical energy being directed to this layer, (ii) a front contact which has a thickness in the range of 2 to 4 μm of LPE indium phosphide of n+ type and a doping of the order of $10^{18}$–$10^{19}$cm⁻³ disposed on the first layer, (iii) a metallization on said front contact layer on an opposite face from the first layer for providing one contact for the extraction of electrical energy, which metallization covers a relatively small part of the opposite face, (iv) a buffer layer also on the said opposite face of the front contact layer, which buffer layer has a thickness of the order of 1 μm, and is of LPE indium phosphide, n⁻ type doping of the order of $10^{16}$cm⁻³, (v) a layer of LPE indium gallium arsenide, n⁻ type doping of the order of $10^{16}$cm⁻³, which layer has a thickness of the order of 3 μm, (vi) another layer of LPE indium gallium arsenide having a thickness of the order to 5 μm and being p+ type doping of the order of $10^{18}$cm⁻³, and (vii) a titanium gold alloy metallization on the outer face of the layer of p+ type indium gallium arsenide, which metallization provides another contact for the extraction of electrical energy.

2. An arrangement as claimed in claim 1, wherein all of the optical fibres have core sizes of the order of 150–300 μm.

3. An arrangement as claimed in claim 1, wherein the other end of the first optical fibre is coupled via separate fibre lengths to a plurality of individual detectors which together comprise said remote power consuming station detector.

4. An arrangement as claimed in claim 3, wherein the individual detectors have respective electrical outputs, which outputs are connected together to drive the utilization device.

5. An arrangement as claimed in claim 1, wherein the remote power consuming station utilization device includes a battery charged by the output of the detector.

6. An arrangement as claimed in claim 4, including a mono-mode type optical fibre extending between the power generation station and the remote power consuming station with said optical fibre means, and wherein the remote power consuming station further includes means for launching data-conveying optical signals into the mono-mode fibre at the power consuming station, and the power generation station includes receiving means responsive to data received via said mono-mode fibre.

7. A power transmission arrangement in which operating power for a remote device is conveyed as light, the arrangement comprising a power generation station for generating optical power, a remote power consuming station separated from said power generation station, and optical fibre means coupling the power generation station to the power consuming station for conveying said optical power thereto, said optical fibre means being a long wavelength multimode type of fibre having a relatively thick core size in the range of 50 to 400 μm, the power generation station including a plurality of high-power gas or solid-state lasers or superluminescent diodes, each having an optical output with a wavelength of the order of 0.70 to 1.7 μm, and each feeding light energy into a corresponding length of multimode optical fibre, the lengths being arranged together as a multicore cable comprising said optical fibre means, and means for inputting the optical power output of the power generation station into one end of the said optical fibre means, the remote power consuming station including a photo-responsive detector upon which the optical power conveyed thereto and output from another end of the said optical fibre means falls, and a utilization device coupled to the detector for utilizing said power, and wherein the detector includes a layered structure of the following layers:

(i) a first relatively thick layer of the order of 200 μm of indium phosphide doped to have an n⁻ semi-insulating characteristic for receiving optical energy being directed to this layer, (ii) a front contact which has a thickness in the range of 2 to 4 μm of LPE indium phosphide of n+ type and a doping of the order of $10^{18}$–$10^{19}$cm⁻³ disposed on the first layer (iii) a metallization on said front contact layer on an opposite face from the first layer for providing one contact for the extraction of electrical energy, which metallization covers a relatively small part of the opposite face, (iv) a buffer layer also on the said opposite face of the of the front contact layer, which buffer layer has a thickness of the order of 1 μm, and is of LPE indium phosphide, n⁻ type doping of the order of $10^{16}$cm⁻³, (v) a layer of LPE indium gallium arsenide, n⁻ type doping of the order of $10^{16}$cm⁻³, which layer has a thickness of the order of 3 μm, (vi) another layer of LPE indium gallium arsenide having a thickness of the order of 5 μm and being p+ type doping of the order of $10^{18}$cm⁻³, and (vii) a titanium gold alloy metallization on the outer face of the layer of p+ type indium gallium arsenide, which metallization provides another contact for the extraction of electrical energy.

8. An arrangement as claimed in claim 7, wherein all of the optical fibres all have core sizes of the order 9. A power transmission arrangement in which operating power for a remote device is conveyed as light, the arrangement comprising a power generation station for generating optical power, a remote power consuming station separated from said power generation station, and optical fibre means coupling the power generation station to the power consuming station for conveying said optical power thereto, said optical fibre means being a long wavelength multimode type of fibre having a relatively thick core size in the range of 50 to 400 μm, the power generation station including a plurality of high-power gas or solid-state lasers or superluminescent diodes, each having an optical output with a wavelength of the order of 0.70 to 1.7 μm and each feeding light energy into a single optical fibre comprising said optical fibre means, and the optical output of the power generation station being input to one end of the said optical fibre means, and the optical output of the power generation station being input to one end of the said optical fibre means, the remote power consuming including a photo-responsive detector upon which the optical power output conveyed thereto and output from another end of the said optical fibre means falls, and a utilization device coupled to the detector for utilizing said power, and wherein the detector includes a layered structure of the following layers:

(i) a first relatively thick layer of the order of 200 μm of indium phosphide doped to have an n⁻ semi-insulating characteristic for receiving optical energy being directed to this layer, (ii) a front contact which has a thickness in the range of 2 to 4 μm of LPE indium phosphide of n+ type and a doping of the order of $10^{18}$–$10^{19} cm^{-3}$ disposed on the first layer, (iii) a metallization on said front contact layer on an opposite face from the first layer for providing one contact for the extraction of electrical energy, which metallization covers a relatively small part of the opposite face, (iv) a buffer layer also on the said opposite face of the front contact layer, which buffer layer has a thickness of the order of 1 μm, and is of LPE indium phosphide, n⁻ type doping of the order of $10^{16} cm^{-3}$, (v) a layer of LPE indium gallium arsenide, n⁻ type doping of the order of $10^{16} cm^{-3}$, which layer has a thickness of the order of 3 μm, (vi) another layer of LPE indium gallium arsenide having a thickness of the order of 5 μm and being p+ type doping of the order of $10^{18} cm^{-3}$, and (vii) a titanium gold alloy metallization on the outer face of the layer of p+ type indium gallium arsenide, which metallization provides another contact for the extraction of electrical energy.

10. An arrangement as claimed in claim 9 wherein the lasers are pulsed and cooled to increase the power handling capacity thereof.

* * * * *

UNITED STATES PATENT AND TRADEMARK OFFICE
CERTIFICATE OF CORRECTION

PATENT NO. : 4,928,319

DATED : May 22, 1990

INVENTOR(S) : PITT et al

It is certified that error appears in the above-identified patent and that said Letters Patent is hereby corrected as shown below:

ON TITLE PAGE:

Item [57] Abstract, lines 7 and 9, "um" should read -- $\mu$m --.

Column 8, line 42, please add after word "order" --of 150-300 $\mu$m--.

Please correct the address of the first-named inventor, Gilles D. Pitt, to read --Saffron, Walden--.

Signed and Sealed this

Twenty-seventh Day of August, 1991

Attest:

HARRY F. MANBECK, JR.

*Attesting Officer*  *Commissioner of Patents and Trademarks*